(12) United States Patent
Lin

(10) Patent No.: US 6,477,447 B1
(45) Date of Patent: Nov. 5, 2002

(54) METHODS TO GENERATE NUMERICAL PRESSURE DISTRIBUTION DATA FOR DEVELOPING PRESSURE RELATED COMPONENTS

(75) Inventor: Chi-Fa Lin, Hsinchu (TW)

(73) Assignee: Winbond Electronics, Corp., Hsinchu (TW)

( * ) Notice: Subject to any disclaimer, the term of this patent is extended or adjusted under 35 U.S.C. 154(b) by 0 days.

(21) Appl. No.: 09/417,866

(22) Filed: Oct. 13, 1999

(30) Foreign Application Priority Data

Jul. 28, 1999 (TW) ........................ 88112770 A

(51) Int. Cl.⁷ ..................... G05D 15/00; G01L 13/02; G01B 11/16
(52) U.S. Cl. ................... 700/301; 700/121; 73/762; 438/14; 702/138
(58) Field of Search .................. 700/121, 97, 110, 700/301; 702/41, 42, 98, 138; 438/14; 703/6, 7; 73/762, 789, 790, 791

(56) References Cited

U.S. PATENT DOCUMENTS

| | | | | |
|---|---|---|---|---|
| 4,142,404 A | * | 3/1979 | Ogata et al. | 427/150 |
| 5,325,721 A | * | 7/1994 | Pendergrass, Jr. | 116/216 |
| 5,444,637 A | * | 8/1995 | Smesny et al. | 438/16 |
| 5,599,423 A | * | 2/1997 | Parker et al. | 156/345 |
| 6,033,987 A | * | 3/2000 | Lin et al. | 156/345 |
| 6,169,931 B1 | * | 1/2001 | Runnels | 700/121 |
| 6,201,467 B1 | * | 3/2001 | Winterer et al. | 257/417 |

\* cited by examiner

Primary Examiner—Maria N. Von Buhr
Assistant Examiner—Paul Rodriguez
(74) Attorney, Agent, or Firm—Fish & Richardson P.C.

(57) ABSTRACT

A method of detecting surface pressure distribution of a wafer being processed by a CMP (Chemical Mechanical Polishing) process; more specifically, the invention relates to a method of detecting pressure distribution of a wafer surface by employing pressure sensitive films located on various pressure components such as a wafer carrier, a polishing pad, and mechanical arm members of a CMP machine for detecting pressure-related data during different stages of a CMP process. Further, sensed pressure-related data are collected for feedback loop controls of digital image mapping, numeration, simulation, and forecasting, from which more mechanical components of high precision and better circuit layouts on the wafer can then be developed.

23 Claims, 6 Drawing Sheets

METHODS TO GENERATE NUMERICAL PRESSURE DISTRIBUTION DATA FOR DEVELOPING PRESSURE RELATED COMPONENTS

BACKGROUND OF THE INVENTION

1. Field of the Invention

The present invention relates to a method of detecting surface pressure distribution of a wafer being processed by a CMP (Chemical Mechanical Polishing) process; more specifically, the invention relates to a method of detecting pressure distribution on a wafer surface by employing pressure sensitive films located on various pressure components such as a wafer carrier, a polishing pad, and mechanical arm members of a CMP machine for detecting pressure-related data during different stages of a CMP process so that better pressure components can be designed accordingly.

2. Description of Related Art

In any manufacture of ULSI (Ultra-Large-Scale Integration) devices, a precise and stable CMP (Chemical Mechanical Polishing) process has always been a key in maintaining high production yield. Of all the pressure related components contained in a CMP machine, the electro-static-chuck, the mechanical arm, and wafer clamps on a wafer carrier are the most crucial in directly effecting the yield and finishing quality of the CMP process. Currently, there is no available semiconductor equipment that can provide feedbacks of pressure-related data including image data mapping, numeration, simulation, and forecasting for either manual or automatic surface pressure correction on a wafer.

FIG. 1 shows a frontal view depicting relative positions of a wafer carrier 12, a wafer 10, and a polishing pad 14 of a conventional CMP device. The wafer carrier 12, together with a wafer 10, is to be pushed towards the polishing pad 14 so that exposed surface of the wafer 10 touches the parallel polishing pad surface for a chemical mechanical polishing. The body structure of the wafer carrier is made of steel, and a rubber ring 16 is installed on the working surface of the wafer carrier 12 cushioning a wafer, which is securely held on top of the airtight rubber ring by vacuum pressure during a CMP operation. The vacuum is actuated by evacuating air, with a pump, through a center hole 18 on the wafer carrier 12. A wafer 10 will then stick to the working surface of the wafer carrier 12 when air is pumped out of the center hole 18. The polishing pad 14 is made of composite fiber-like materials knit in various patterns depending on application. The knitting patterns can be of grid pattern, concentric circle pattern, or radiating pattern such that different patterns provide different contacting surface pressure distributions during the CMP process. Further, a number of factors also decide the surface pressure distribution of a silicon wafer during the CMP process, and they are: condition of the rubber ring 16, vacuum efficiency actuated through the center hole 18 of the wafer carrier 12, and material type of polishing pad 14 (such as type of fiber, coefficient of elasticity, fiber size, and weight ratio, etc). The knitting pattern of said polishing pad 14 is of crucial importance in any chemical mechanical polishing process. Therefore, obtaining a database regarding the distribution of surface pressure through sensors located on various pressure related components of a CMP machine can significantly improve the process in development of new components, problem diagnosis, and controlling and maintaining the overall quality of the CMP process.

FIG. 2A and 2B depict simplified frontal views of conventional wafer-manipulating devices such as an electrostatic-chuck or a wafer clamp, so wafers can be conveyed between separate processing chambers securely. For instance, a conventional wafer-manipulating device consists of a mechanical arm with a steel-structured arm members wherein an air opening 24 or a suction cup 24' is adapted as a gripper to pick up and transfer wafers, one by one, to a specified location. Surrounding the wafer will be a plurality of circularly arranged claws 26 or a vacuum-assisted rubber ring 26' to prevent any slipping of the silicon wafer during transferring. As it is with any other conventional vacuum-actuated wafer gripping devices, if the vacuum is too weak, the wafer may loose its grip and fall; if the vacuum is too strong, the wafer may warp or even break. Similarly, if the positioning rubber ring 26 or claws 26 are too loose, then the wafer being transferred may fall or somehow be shifted slightly; the opposite of which will cause the wafer to warp or break.

SUMMARY OF THE INVENTION

In order to alleviate the aforementioned problems caused by an unevenly distributed surface pressure of a silicon wafer during a CMP process, a method according to preferred embodiment of the present invention is provided to detect surface pressure distribution via pressure sensitive film and obtain image data of surface pressure distribution under different operating conditions for process analysis and correction. Specifically, sensed pressure data are fed to a microprocessor to perform a real-time feedback loop analysis for instant digital image mapping, numeration, simulation, and forecasting, from which more mechanical components of higher precision to be used by the CMP machine can be developed.

Accordingly, it is an object of the present invention to provide a pressure detecting method by placing a plurality of pressure sensitive films located on contacting surfaces of various pressure related components such as the wafer carrier, the polishing pad, and the mechanical arm of a CMP machine for pressure-sensing of a wafer surface during different stages of a CMP process. When a silicon wafer, or wafer, is securely held by the wafer carrier, the pressure-sensing films immediately start to collect pressure-related data during different stages of the CMP process, whereby a corresponding digital image of pressure-related data about the wafer is immediately processed by a computer and displayed by a monitor.

It is another object of the present invention to provide a data analyzing method for processing pressure distribution data of various pressure related components during a wafer CMP process so that suitable input parameter sets for different operating conditions can be established. The established parameter sets are very helpful in improving production yield and efficiency.

Furthermore, pressure distribution data of the pressure related components can be obtained and analyzed at the same time as the pressure distribution data of a wafer are collected. The pressure distribution data on the pressure related components are systematically contrasted and analyzed in order to suitably modify the pressure related components; in addition, it is more convenient to maintain a good working order of the pressure related components with the help of the pressure distribution data set.

According, it is necessary for the present invention to provide a method of pressure detection on the surfaces of the wafer and the pressure related components so that sets of input parameters can be generated by feedback loop analysis for system correction and modification and for further improvements on overall wafer CMP process. Specifically, the invention relates to a method of detecting pressure distribution on a wafer surface by employing pressure sensitive films located on various pressure components such as a wafer carrier, a polishing pad, and mechanical arm members of a CMP machine for detecting pressure-related data during different stages of a CMP process. Such method of wafer pressure detection is accomplished by first providing a pressure related component and a wafer, having pressure sensitive films bonded to the pressure components, subjecting the wafer and the pressure related components to various pressure conditions, applying pressures of different intensity to various surfaces of the sub-assembly, and processing and saving pressure image data collected via the pressure sensitive films. In particular, the pressure image data are captured with a scanner or a digital camera, fed into a computer, and various pressure image data are then compared and analyzed by a microprocessor. Further, the microprocessor is to simulate pressure distribution data on the pressure components under different operating conditions, so optimum controlling procedures can be established according to input parameter sets generated by computer feedback loop analysis. The acquired pressure distribution knowledge is advantageous for further development of new mechanical pressure components, modification of input parameters, and diagnosis of any operational abnormalities.

The pressure sensitive film according to an embodiment of the present invention comprises a color-forming layer and a color-developing layer of polyester base material bonded together as one sheet. Alternatively, the pressure sensitive film can also be of a single layer polyester film with the color-forming material coated to a surface of the film and the color-developing material coated to the other surface. In both cases, the color-forming layer is composed of a plurality of microcapsules of color-forming material.

In addition, the pressure components applied in the embodiment of the present invention refer to, but not limited to, mechanical CMP pressure related components including a wafer carrier, a polishing pad, and mechanical arm members of a CMP machine.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE PREFERRED EMBODIMENT

It is an object of the present invention to provide a method of pressure detection on the surfaces of the wafer and the pressure related components so that different modes of feedback loop analysis for system correction and modification can be generated for further improvements on the wafer CMP process.

Figure 3A:
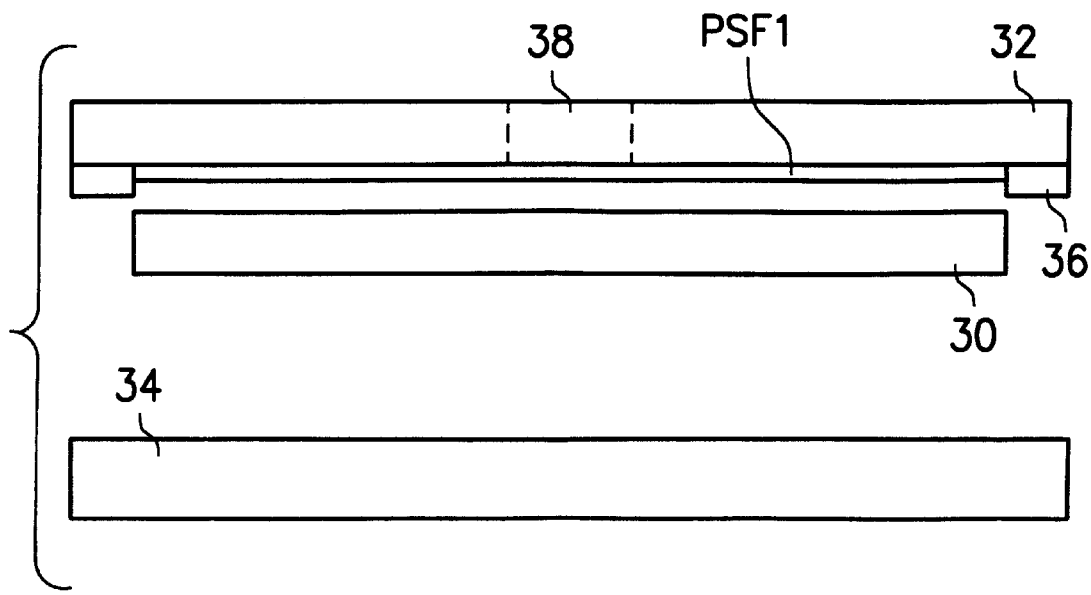
FIG. 3A is a side view of a wafer carrier and polishing pad arrangement of a CMP machine, wherein a detecting method of pressure distribution is applied according to an embodiment of the present invention.
Figure 3B:
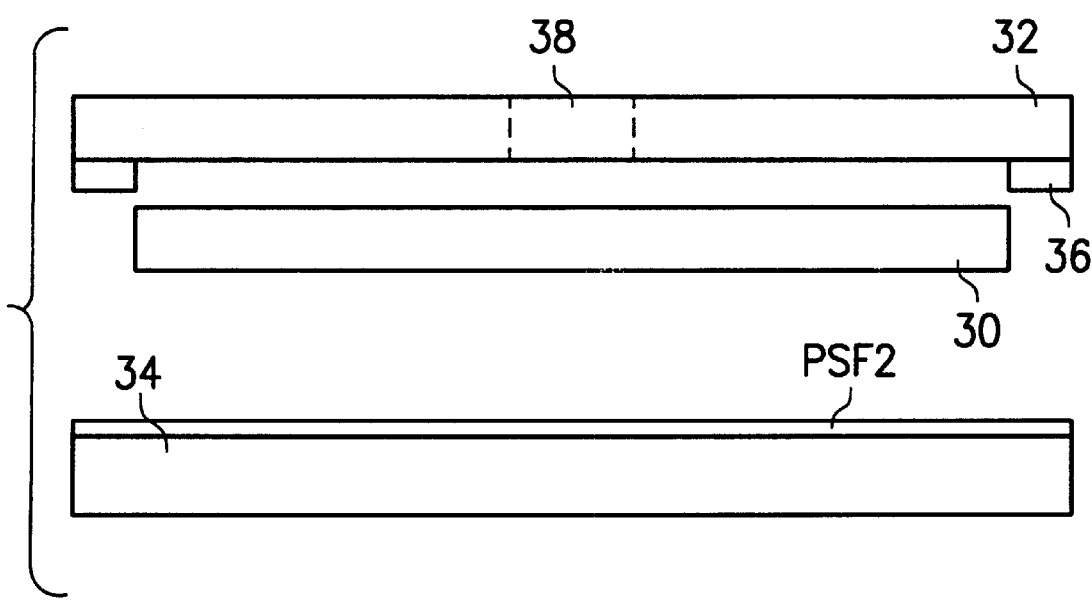
FIG. 3B is a side view of another wafer carrier and polishing pad arrangement of a CMP machine, wherein a detecting method of pressure distribution is applied according to an embodiment of the present invention.

Referring to FIG. 3A, a side view of a wafer carrier and a polishing pad belonging to a CMP machine is shown, the components of which are arranged in such a fashion that a method to detect pressure distribution can be directly applied on the surfaces. One of the surface of the wafer 30 to be processed by CMP is in contact with the surface of the wafer carrier 32 in holding position, and both of these two components are to be pushed towards the polishing pad 34 until the other surface of the wafer 30 overlaps and touches the surface of the polishing pad 34. The body structure of the wafer carrier 32 is made of steel, and a rubber ring 36 is installed on the working surface of the wafer carrier 32 cushioning a wafer 30, which is securely held on top of the airtight rubber ring by vacuum pressure during a CMP operation. The vacuum is actuated by evacuating air, with a pump, through a center hole 38 on the wafer carrier 32. A wafer 30 will then stick to the working surface of the wafer carrier 32 when air is pumped out of the center hole 38. The polishing pad 34 is made of composite fiber-like materials knit in various patterns depending on application. The knitting patterns can be of grid pattern, concentric circle pattern, or radiating pattern such that different knitting pattern provide different contacting surface pressure distribution during the CMP process. For the purpose of detecting and measuring pressure distribution on the surface of the wafer carrier 32 under various operating conditions, pressure sensitive films PSF1 are bonded to at least a surface of the wafer carrier component for detecting pressure distributions that would significantly effect the composition of the following elements: the rubber ring 36, vacuum pressure through the center hole 38 of the wafer carrier 32, material type of the polishing pad 34 (such as type of fiber, coefficient of elasticity, fiber size, and weight ratio etc), knitting pattern of the polishing pad 34 etc.

Figure 5A:
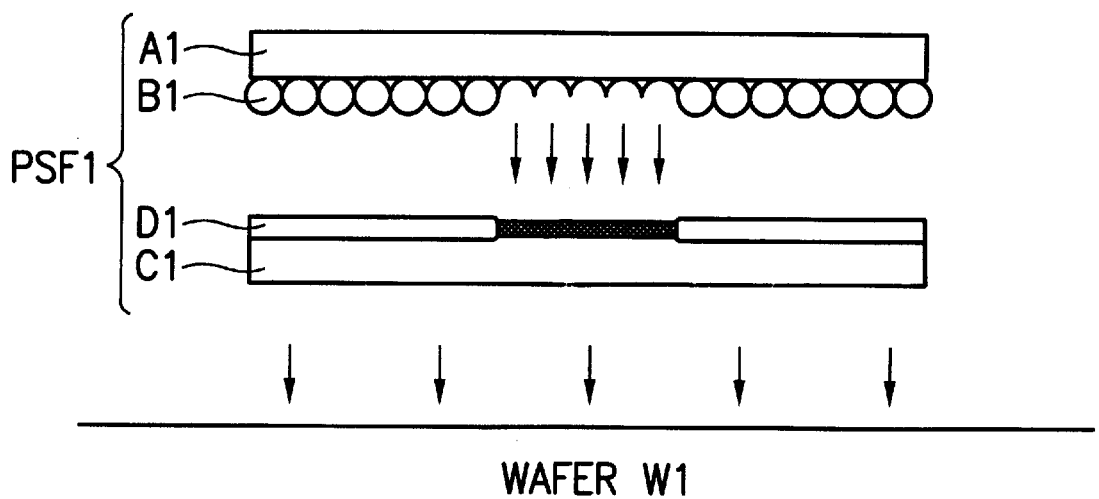
FIG. 5A is a cross-sectional view of a type of pressure sensitive film according to an embodiment of the present invention.
Figure 5B:
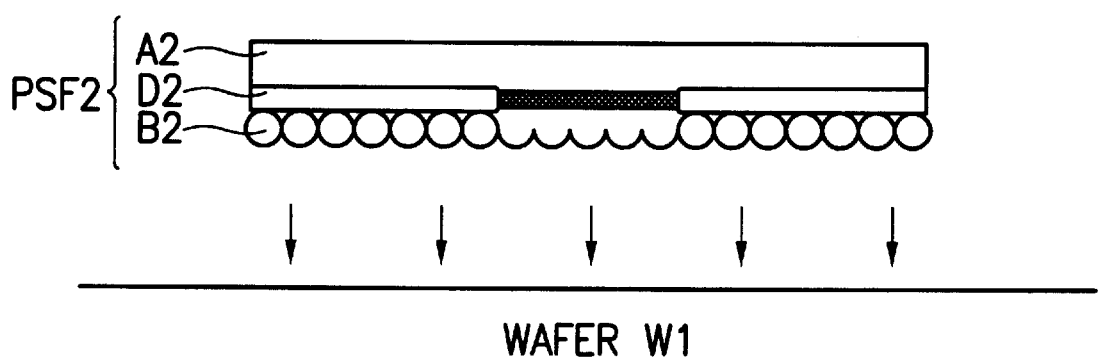
FIG. 5B is a cross-sectional view of another type of pressure sensitive film according to an embodiment of the present invention.

As shown in FIG. 5A, the pressure sensitive film PSF1 according to the present invention comprises a color-forming layer B1 and a color-developing layer D1 of polyester base materials A1 and C1, respectively bonded together as one sheet. Alternatively, as shown in FIG. 5B, the pressure sensitive film PSF2 can also be of a single layer polyester film A2 with the color-forming material B2 coated to a surface of the film and the color-developing material D2 coated to the other surface. In both cases, the color-forming layer, B1 or B2, is composed of a plurality of microcapsules of color-forming material. When pressure is exerted on the pressure sensitive film PSF1, microcapsules of color-forming layer B1, B2 burst and release color-forming pigments. The color-forming then further react with the color-developing layer D1, D2 to produce different intensities of visible colors. In particular, the microcapsules are designed with PSC (Particle Size Control) technology so that different colors or intensities are shown to indicate the variation in pressure force. Consequently, various intensities of the pressure distribution are clearly indicated by the pressure sensitive film PSF1, which shows different colors or intensities of colors according to different intensities of pressure force.

With the pressure sensitive films PSF1 bonded to surfaces, the wafer carrier 32 holds the wafer 30 and operates as any other conventional CMP process, and pressure distribution on the wafer carrier 32 under various operating conditions can then be detected and measured from images shown by the pressure sensitive films PSF1.

Figure 1:
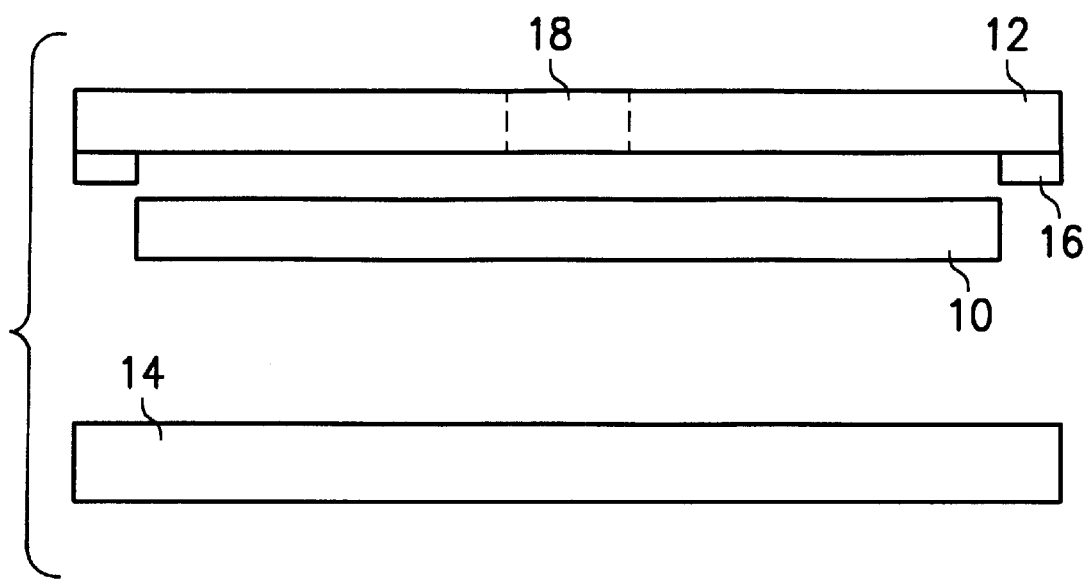
FIG. 1 shows a frontal view depicting relative positions of a wafer carrier 12, a wafer 10, and a polishing pad 14 of a conventional CMP device.
Figure 2A:
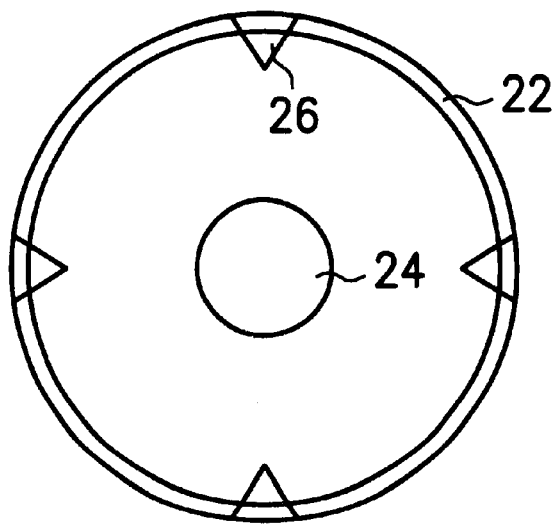
FIG. 2A depicts a simplified frontal view of a conventional wafer-manipulating device with wafer clamps.
Figure 2B:
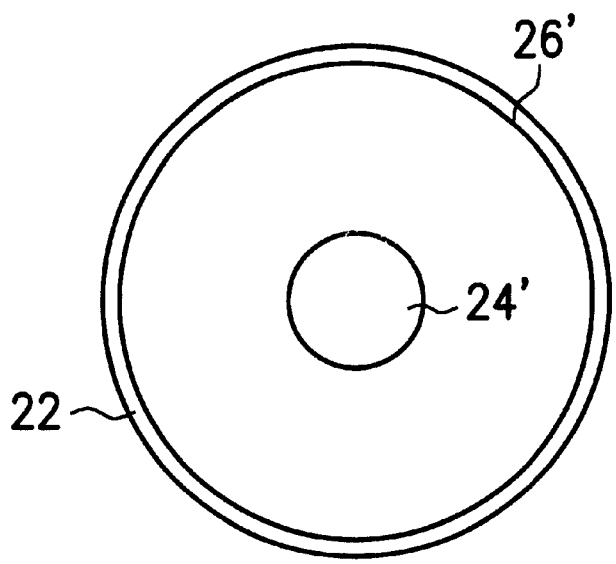
FIG. 2B depicts a simplified frontal view of a conventional wafer-manipulating device with an electro-static-chuck.
Figure 4A:
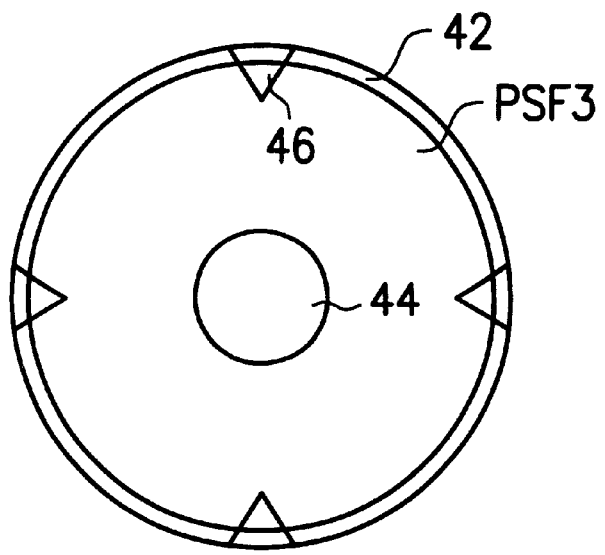
FIG. 4A depicts a simplified frontal view of a CMP pressure component arrangement.
Figure 4B:
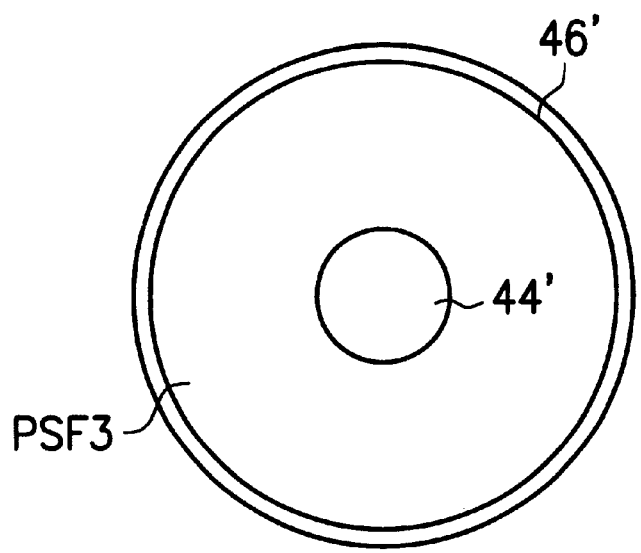
FIG. 4B depicts a simplified frontal view of another CMP pressure component arrangement.

FIG. 4A and 4B show simplified frontal views of two different CMP conveyer devices. Similar to the structures shown in FIG. 2A and 2B, a CMP conveyer device such as the mechanical arm consists of steel body structure 42, with a center air hole 44 or a rubber ring 44', has a plurality of circularly arranged claws 46 or a vacuum-assisted rubber ring 46' serving as a suction pad to prevent any slipping of the silicon wafer 20 during transferring. As shown by FIG. 4A and 4B, a pressure sensitive film PSF3 is bonded to the surface of the wafer conveyer device in order to detect and measure the pressure distribution on the surface of the conveyer device under various conditions. For example, the vacuum pressure exerted through the center air hole 44 and the gripping force exerted by the claws 46 can be systematically measured and numerated by the use of the pressure sensitive film PSF3.

Figure 6:
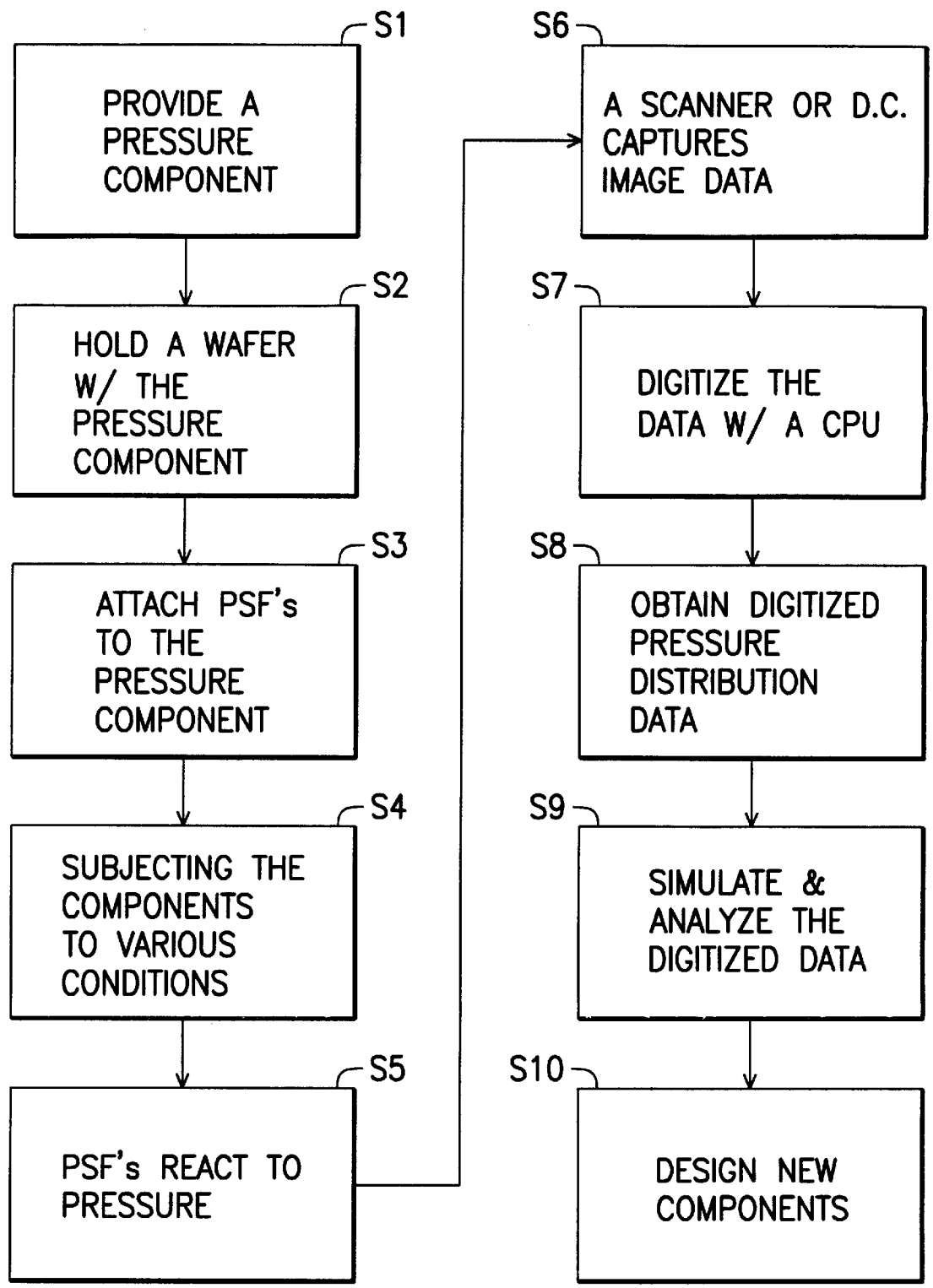
FIG. 6 is a flow chart depicting the overall wafer pressure distribution detecting method of the present invention.

Accordingly, a flow chart depicting the entire scheme of detecting and measuring pressure distribution on a pressure component is shown in FIG. 6.

In Step 1, a pressure related component such as those of a CMP machine (a wafer carrier, a polishing pad, etc) or a wafer conveyer device such as a mechanical arm is provided.

Step 2 indicates a pressure related component holding a wafer during a CMP process or simply for conveying. In particular, the wafer holding pressure component is a wafer carrier.

Step 3 stresses the requisite of having the pressure sensitive films bonded to specified surfaces of the pressure related components.

In Step 4, said pressure related component, together with a wafer and pressure sensitive films, is subjected to various pressure conditions during CMP operations. For example, different intensities of vacuum pressure are exerted through the center air hole 38 of the wafer carrier 32 during different CMP processes. In response, the pressure sensitive films react by changing colors as soon as pressure force is directly exerted upon them as indicated in Step 5.

Furthermore, Step 6 describes the process of capturing image data appeared on a pressure sensitive film by the use of a scanner or a digital camera after the CMP process is finished.

After the image data is captured and input to a computer, a microprocessor takes over to digitize the relevant surface pressure distribution data of a pressure related component as in Step 7. The digitized pressure distribution data of a pressure related component surface is thus obtained, as indicated in Step 8, for the next step of simulation and analysis.

In Step 9, the digitized pressure distribution data of the pressure related component is further simulated and analyzed by a microprocessor with fuzzy-contrasting and feedback-loop analysis methods, which provides a basis for future improvement in the CMP process of a silicon wafer whereas the layout of micro-device dies may be re-arranged due to uneven wafer surface pressure distribution.

Finally, as shown in step 10, new pressure related components can be designed, and sets of input parameter guidelines can thus be established.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of detecting wafer surface pressure distribution, comprising the steps of:
   providing at least one pressure related component and a silicon wafer;
   covering the pressure related component with pressure sensitive films;
   subjecting the pressure related component with pressure sensitive films to various pressure conditions to obtain relevant pressure data;
   collecting and processing relevant pressure data as image data;
   digitizing the image data by a microprocessor to generate pressure-related image data under different operating conditions.

2. The method of detecting wafer surface pressure distribution as claimed in claim 1, wherein the pressure sensitive film comprises two different layers of polyester base material such that a color-forming layer is bonded to a color-developing layer to form a single layer.

3. The method of detecting wafer surface pressure distribution as claimed in claim 1, wherein the pressure sensitive film comprises a single layer of polyester based material with color-forming material coated to a surface of the film and color-developing material coated to the other surface.

4. The method of detecting wafer surface pressure distribution as claimed in claim 2, wherein the color-forming layer is composed of a plurality of microcapsules of color-forming material.

5. The method of detecting wafer surface pressure distribution as claimed in claim 1, wherein the pressure related component is a wafer carrier of a chemical mechanical polishing machine.

6. The method of detecting wafer surface pressure distribution as claimed in claim 1, wherein the pressure related component is a polishing pad of a chemical mechanical polishing machine.

7. The method of detecting wafer surface pressure distribution as claimed in claim 1, wherein the pressure related component is a mechanical arm for wafer holding or transferring.

8. The method of detecting wafer surface pressure distribution as claimed in claim 1, wherein the image data of pressure distribution appearing on the pressure sensitive film are captured by a scanner and inputted to a computer.

9. The method of detecting wafer surface pressure distribution as claimed in claim 1, wherein the image data of pressure distribution appearing on the pressure sensitive film are captured by a digital camera and inputted to a computer.

10. The method of detecting wafer surface pressure distribution as claimed in claim 1, wherein the image data of pressure distribution are digitized by an image processing device.

11. The method of detecting wafer surface pressure distribution as claimed in claim 1, wherein digitized pressure distribution data are analyzed and simulated by a microprocessor with fuzzy-contrasting and feedback-loop analysis methods.

12. A data analyzing method for processing pressure distribution data of various pressure components during a wafer chemical mechanical polishing process, comprising the steps of:

provoding at least one pressure related component and a silicon wafer;

covering the pressure related component with pressure sensitive films;

subjecting the pressure related component with pressure sensitive films to various pressure conditions to obtain relevant pressure data;

collecting and digitizing relevant pressure data as image data; and simulating various operating conditions by which different sets of operating parameters can be generated for optimum yield and performance of a chemical mechanical polishing machine.

13. The data analyzing method as claimed in claim 12, wherein the pressure sensitive film comprises two different layers of polyester based material such that a color-forming layer is bonded to a color-developing layer to form a single layer.

14. The data analyzing method as claimed in claim 12, wherein the pressure sensitive film comprises a single layer of polyester based material with color-forming material coated to a surface of the film and color-developing material coated to the other surface.

15. The data analyzing method as claimed in claim 13, wherein the color-forming layer is composed of a plurality of microcapsules of color-forming material.

16. The data analyzing method as claimed in claim 12, wherein the pressure related component is a wafer carrier of the chemical mechanical polishing machine.

17. The data analyzing method as claimed in claim 12, wherein the pressure related component is a polishing pad of the chemical mechanical polishing machine.

18. The data analyzing method as claimed in claim 12, wherein the pressure related component is a mechanical arm of the chemical mechanical polishing machine for wafer transferring.

19. The data analyzing method as claimed in claim 12, wherein the image data of pressure distribution appearing on the pressure sensitive film are captured by a scanner and inputted to a computer.

20. The data analyzing method as claimed in claim 12, wherein the image data of pressure distribution appearing on the pressure sensitive film are captured by a digital camera and inputted to a computer.

21. The data analyzing method as claimed in claim 12, wherein the image data of pressure distribution are digitized by an image processing microprocessor.

22. The data analyzing method as claimed in claim 21, wherein the image data of pressure distribution are further analyzed and simulated by fuzzy-contrasting and feedback-loop analysis methods.

23. The data analyzing method as claimed in claim 14, wherein the color-forming layer is composed of a plurality of microcapsules of color-forming material.

* * * * *